United States Patent
Andrews et al.

(10) Patent No.: US 9,435,858 B2
(45) Date of Patent: Sep. 6, 2016

(54) FOCUSING OPTICAL SYSTEMS AND METHODS FOR TESTING SEMICONDUCTORS

(75) Inventors: Peter Andrews, Beaverton, OR (US); David Hess, Beaverton, OR (US)

(73) Assignee: CASCADE MICROTECH, INC., Beaverton, OR (US)

( * ) Notice: Subject to any disclaimer, the term of this patent is extended or adjusted under 35 U.S.C. 154(b) by 488 days.

(21) Appl. No.: 13/634,009

(22) PCT Filed: Mar. 14, 2011

(86) PCT No.: PCT/US2011/028373
§ 371 (c)(1),
(2), (4) Date: Sep. 11, 2012

(87) PCT Pub. No.: WO2011/113051
PCT Pub. Date: Sep. 15, 2011

(65) Prior Publication Data
US 2013/0010099 A1    Jan. 10, 2013

Related U.S. Application Data

(60) Provisional application No. 61/313,607, filed on Mar. 12, 2010.

(51) Int. Cl.
*G01R 31/28* (2006.01)
*G01B 9/04* (2006.01)
*G01B 21/16* (2006.01)

(52) U.S. Cl.
CPC ................ *G01R 31/2891* (2013.01)

(58) Field of Classification Search
CPC ..... G01N 21/00; G02B 21/1365; H04N 7/18
USPC ................ 348/79, 87, 126; 356/237.5, 500; 438/13, 14; 324/755.11; 382/145
See application file for complete search history.

(56) References Cited

U.S. PATENT DOCUMENTS

| | | | |
|---|---|---|---|
| 4,607,525 A * | 8/1986 | Turner | G01B 13/065 324/750.19 |
| 4,801,977 A * | 1/1989 | Ishizaka | G03F 7/70241 355/30 |
| 5,394,100 A | 2/1995 | Bohler et al. | |

(Continued)

FOREIGN PATENT DOCUMENTS

| EP | 1884789 A2 * | 2/2008 |
|---|---|---|
| JP | 11-251379 | 9/1999 |

(Continued)

OTHER PUBLICATIONS

English-language abstract of Japanese Patent Publication No. JP2008281535, Nov. 20, 2008.

(Continued)

*Primary Examiner* — Christopher S Kelley
*Assistant Examiner* — Kathleen Walsh
(74) *Attorney, Agent, or Firm* — Dascenzo Intellectual Property Law

(57) ABSTRACT

Focusing optical systems and methods for testing semiconductors are disclosed herein. The methods include receiving an image of a probe through a single optical path of a microscope, substantially focusing the microscope on the probe, and determining a vertical height adjustment between the probe and a device under test based upon the focusing.

18 Claims, 11 Drawing Sheets

(56) References Cited

U.S. PATENT DOCUMENTS

| | | | |
|---|---|---|---|
| 5,657,394 A | 8/1997 | Schwartz | |
| 5,861,759 A | 1/1999 | Bialobrodski et al. | |
| 5,883,704 A * | 3/1999 | Nishi | G03B 27/26 355/30 |
| 6,096,567 A * | 8/2000 | Kaplan | G01R 31/2831 324/750.23 |
| 6,124,725 A * | 9/2000 | Sato | 324/754.03 |
| 6,500,683 B1 | 12/2002 | Nakabayashi et al. | |
| 6,583,638 B2 * | 6/2003 | Costello et al. | 324/750.09 |
| 6,721,047 B2 * | 4/2004 | Shimoda | G01N 21/95684 250/559.45 |
| 6,765,647 B1 * | 7/2004 | Nishi | G03F 7/70808 250/492.2 |
| 6,809,824 B1 * | 10/2004 | Yates et al. | 356/400 |
| 6,965,226 B2 | 11/2005 | Dunklee | |
| 7,297,945 B2 | 11/2007 | Hazaki et al. | |
| 7,492,176 B2 * | 2/2009 | Chiba et al. | 324/750.28 |
| 7,629,805 B2 * | 12/2009 | Li | 324/750.22 |
| 8,111,938 B2 * | 2/2012 | Bryll | G02B 7/36 382/255 |
| 2002/0017916 A1 * | 2/2002 | Costello et al. | 324/760 |
| 2002/0018191 A1 * | 2/2002 | Suzuki | G03B 27/34 355/53 |
| 2002/0036769 A1 * | 3/2002 | Shimoda | G01N 21/95684 356/237.1 |
| 2003/0026190 A1 * | 2/2003 | Hendriks | G02B 7/008 369/112.28 |
| 2006/0184041 A1 * | 8/2006 | Andrews | G01R 31/2891 600/476 |
| 2006/0244940 A1 * | 11/2006 | Uehara | G03F 7/70891 355/69 |
| 2007/0076944 A1 * | 4/2007 | Bryll | G06T 3/40 382/152 |
| 2007/0096763 A1 * | 5/2007 | Ehrmann | G01R 31/2891 324/750.23 |
| 2009/0015280 A1 * | 1/2009 | Natori | 324/758 |
| 2009/0085594 A1 | 4/2009 | Yamamoto et al. | |
| 2009/0088999 A1 * | 4/2009 | Bryll | G01B 21/045 702/86 |
| 2009/0103799 A1 * | 4/2009 | Hyon | G03F 1/84 382/145 |
| 2009/0208143 A1 * | 8/2009 | Yoon et al. | 382/321 |
| 2010/0019787 A1 * | 1/2010 | Huebner et al. | 324/754 |
| 2010/0140503 A1 * | 6/2010 | Sugiura | G01N 21/6452 250/459.1 |
| 2010/0158343 A1 * | 6/2010 | Bryll | G02B 7/36 382/141 |
| 2010/0271062 A1 * | 10/2010 | Breinlinger | G01R 31/2891 324/756.03 |

FOREIGN PATENT DOCUMENTS

| | | |
|---|---|---|
| JP | 2008281535 | 11/2008 |
| WO | WO 2007084204 A1 * | 7/2007 |

OTHER PUBLICATIONS

English-language abstract of Japanese Patent Publication No. JP11-251379, Sep. 17, 1999.

* cited by examiner

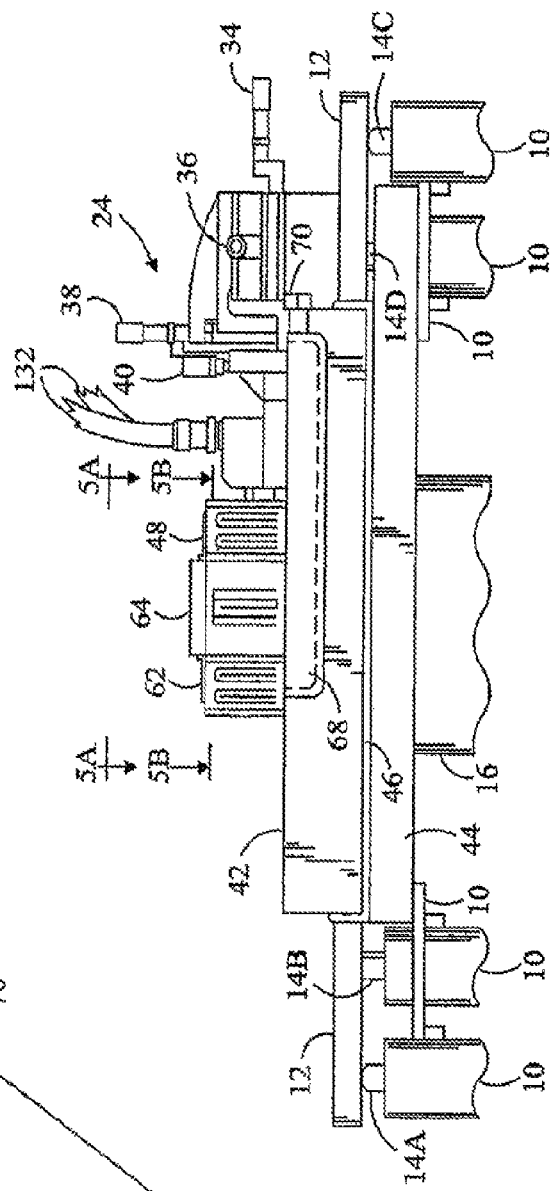
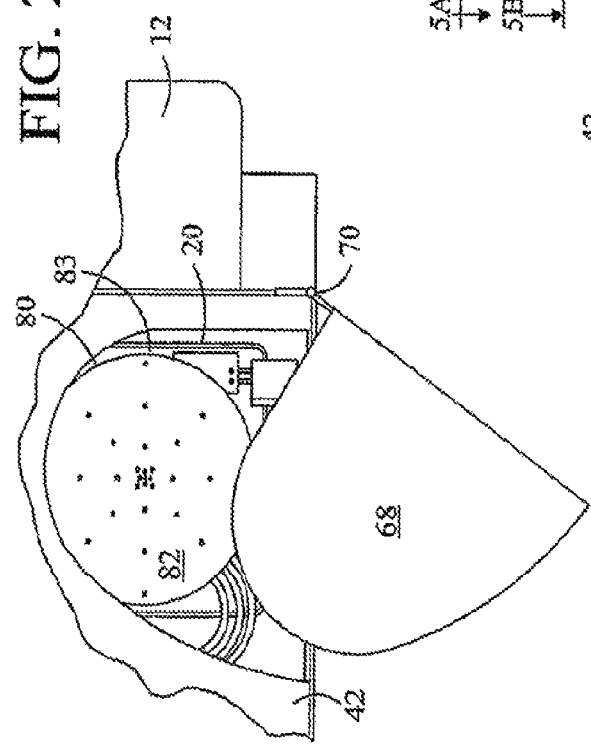
FIG. 2A
FIG. 1

FOCUSING OPTICAL SYSTEMS AND METHODS FOR TESTING SEMICONDUCTORS

CROSS-REFERENCE TO RELATED APPLICATIONS

None

BACKGROUND OF THE INVENTION

The present invention relates to a system that includes an imaging device for effectively testing a semiconductor wafer.

Processing semiconductor wafers include processes which form a large number of devices within and on the surface of the semiconductor wafer (hereinafter referred to simply as "wafer"). After fabrication these devices are typically subjected to various electrical tests and characterizations. In some cases the electrical tests characterize the operation of circuitry and in other cases characterize the semiconductor process. By characterizing the circuitry and devices thereon the yield of the semiconductor process may be increased.

In many cases a probe station, such as those available from Cascade Microtech, Inc., are used to perform the characterization of the semiconductor process. With reference to FIGS. 1, 2 and 3, a probe station comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e., horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes, respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure (fully sealed, partially sealed, or otherwise) is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an electromagnetic interference (EMI), substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing. The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

With particular reference to FIGS. 3, 6 and 7, the chuck assembly 20 is a modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c(FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3 and 3A, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably, the spacers and washers 85 and 86, respectively, are constructed of a material having the lowest possible dielectric constant consistent with high dimensional stability and high volume resistivity. A suitable material for the spacers and washers is glass epoxy, or acetyl homopolymer marketed under the trademark Delrin by E. I. DuPont.

With reference to FIGS. 6 and 7, the chuck assembly 20 also includes a pair of detachable electrical connector assemblies designated generally as 108 and 110, each having at least two conductive connector elements 108a, 108b and 110a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so as to include respective outer shields 108c, 110c surrounding the respective connector elements 108b and 110b, as shown in FIG. 7. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110a are electrically connected in parallel to a connector plate 114 matingly and detachably connected along a curved contact surface 114a by screws 114b and 114c to the curved edge of the chuck assembly element 80. Conversely, the connector elements 108b and 110b are connected in parallel to a connector plate 116 similarly matingly connected detachably to element 81. The connector elements pass freely through a rectangular opening 112a in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108a or 110a, while the other conductor connects the intermediate (guard) connector element of a respective connector 122 or 124 with a respective connector element 108b, 110b. U.S. Pat. No. 5,532,609 discloses a probe station and chuck and is hereby incorporated by reference.

In order to position probes for testing semiconductors, typically on a conductive pad, a microscope may be used. The process for positioning the microscope on the semiconductor is time consuming and laborious. A wide angle field of view objective lens for the microscope is selected and installed. Then the probe is brought into the general field of view of the microscope with the semiconductor thereunder with the objective lens focused on the upper region of the probe. Hence, the upper region of the probe farther away from the probe tip is generally in focus. The lower regions of the probe and the probe tip are generally not in focus due to the limited depth of field of the objective lens. Also, at this point only the larger features of the semiconductor are discernable. The zoom of the microscope may be increased by the operator and the microscope shifted to focus on a further distant part of the probe which provides a narrower field of view so that a middle region of the microscope is in focus. Hence, the upper region of the probe and the probe tip region are generally not in focus when viewing the middle region of the probe due to the limited depth of field of the objective lens. Also, at this point smaller regions of the semiconductor are discernable. The zoom of the microscope may be increased by the operator and the microscope shifted to focus on the probe tip which provides an increasingly narrower field of view so that the probe tip region is generally in focus together with the corresponding devices under test. The lower regions of the probe and the upper regions of the probe are generally not in focus when viewing the probe tip region of the probe due to the limited depth of field of the objective lens.

While it would appear to be straightforward to position a probe tip on a desirable device under test, it turns out that this is a burdensome and difficult task. Often when zooming the microscope the probe goes out of focus and when the microscope is refocused the probe is not within the field of view. When this occurs there is a need to zoom out to a wider field of view and restart the process. Also, when there are several devices in close proximity to one another and a wide field of view is observed, it is difficult to discern which device under test the probe tip is actually proximate. As the microscope is zoomed and an increasingly narrow field of view it tends to be difficult to determine which device the probe is actually testing among a set of closely spaced devices. In many cases, the operator will desire to use a higher magnification microscope, which requires the microscope to be retracted, the objective lens changed, and the microscope moved back into position. Unfortunately, if any movement of the wafer relative to the probe occurs due to environmental conditions or otherwise, the probe will no longer be in close alignment, the probe may miss the pad for the device under test, or may slide off the pad during extended tests.

BRIEF DESCRIPTION OF THE SEVERAL
VIEWS OF THE DRAWINGS

FIG. 1 is a partial front view of an exemplary embodiment of a wafer probe station constructed in accordance with the present invention.

FIG. 2A is a partial top view of the wafer probe station of FIG. 1 with the enclosure door shown partially open.

FIG. 3A is an enlarged sectional view taken along line 3A-3A of FIG. 3.

DETAILED DESCRIPTION OF PREFERRED
EMBODIMENT

Figure 2:
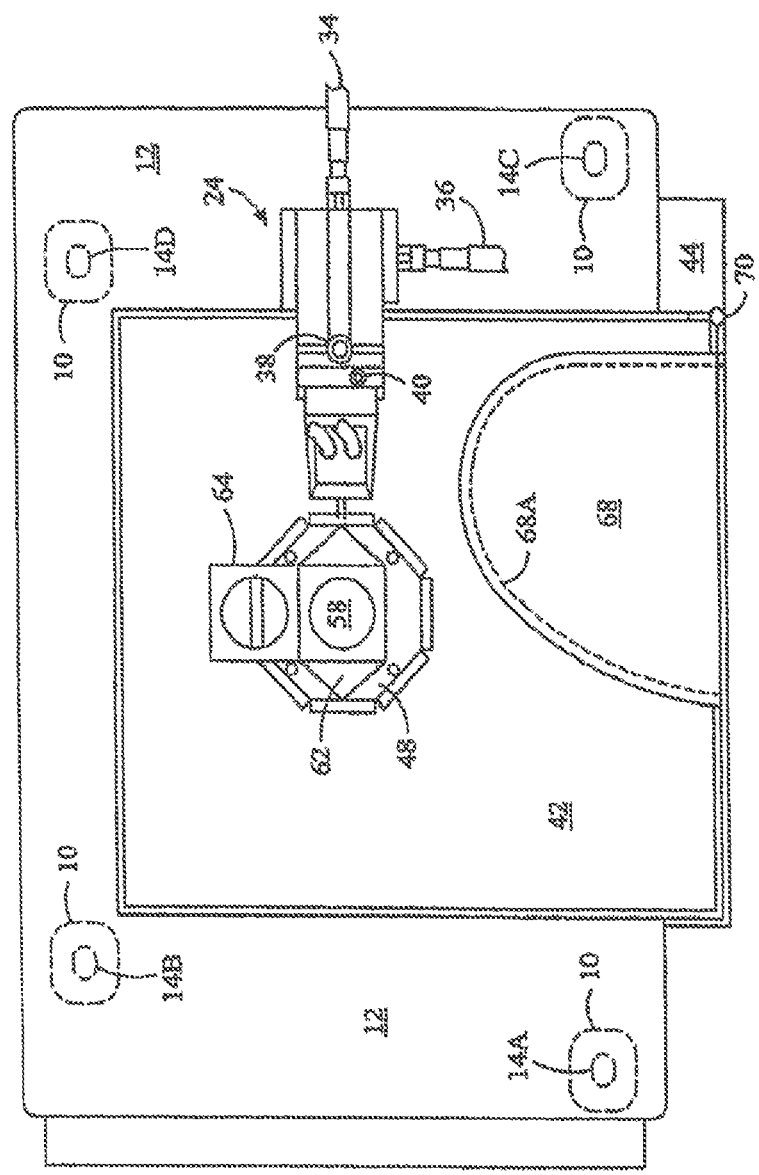
FIG. 2 is a top view of the wafer probe station of FIG. 1.
Figure 3:
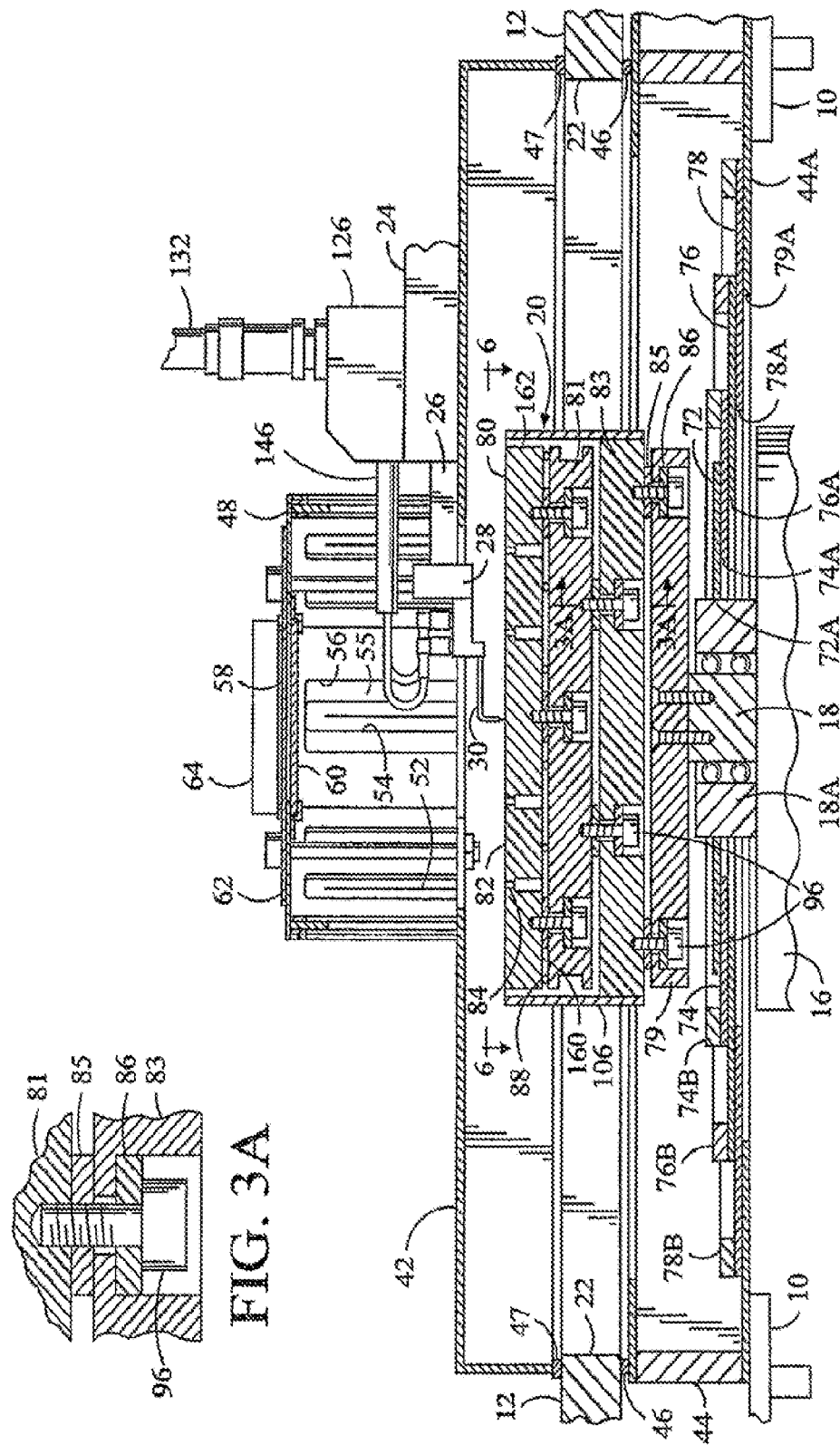
FIG. 3 is a partially sectional and partially schematic front view of the probe station of FIG. 1.
Figure 4:
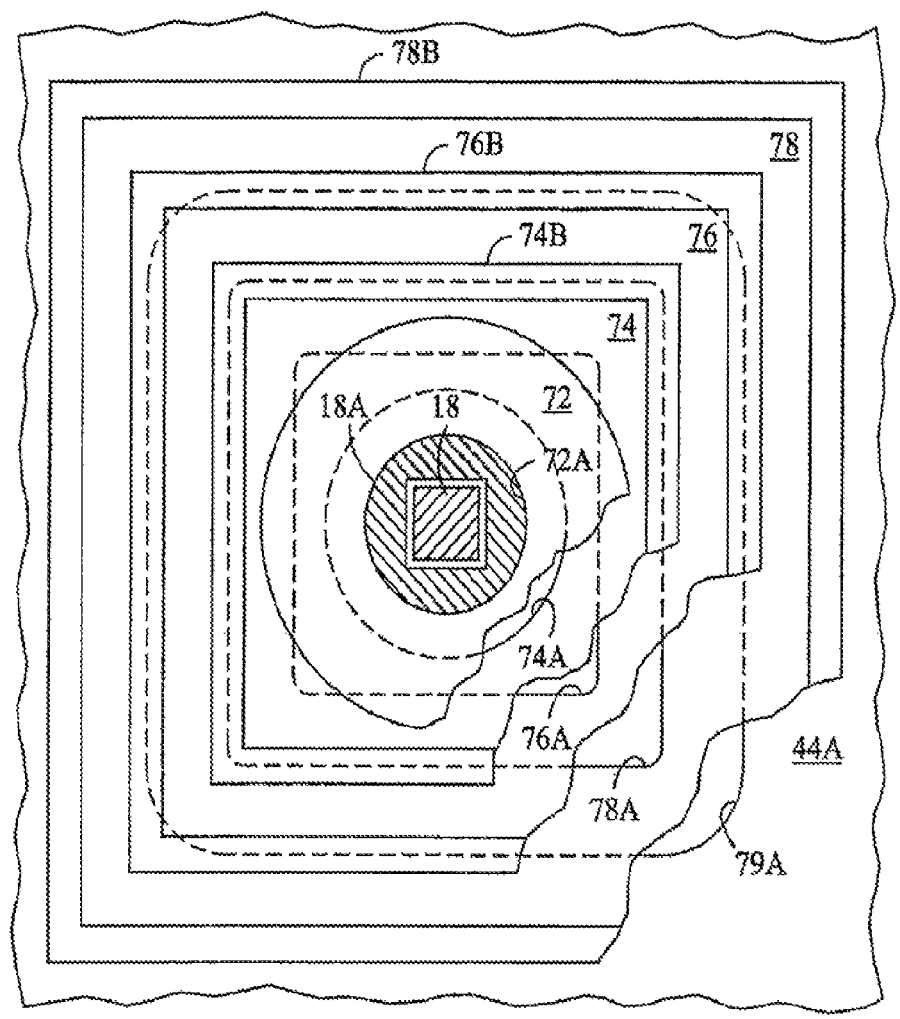
FIG. 4 is a top view of the sealing assembly where the motorized positioning mechanism extends through the bottom of the enclosure.
Figure 5A:
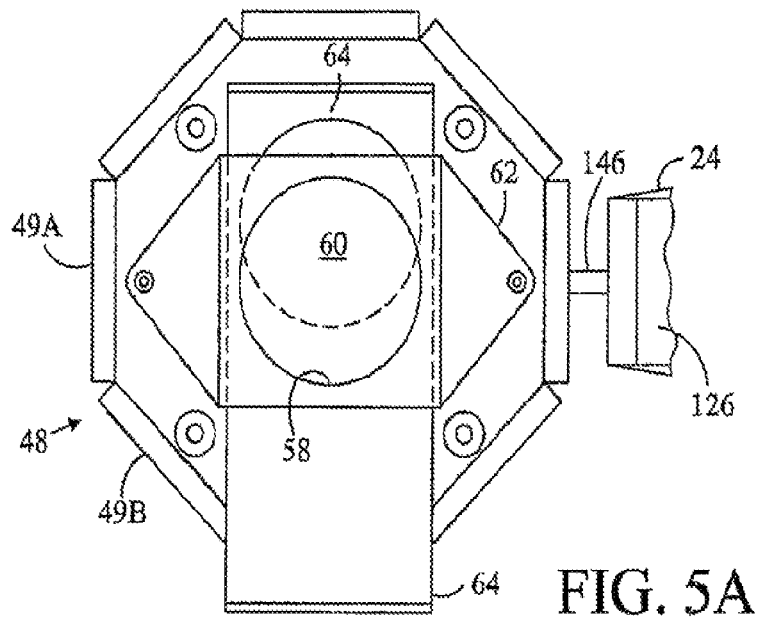
FIG. 5A is an enlarged top detail view taken along line 5A-5A of FIG. 1.
Figure 5B:
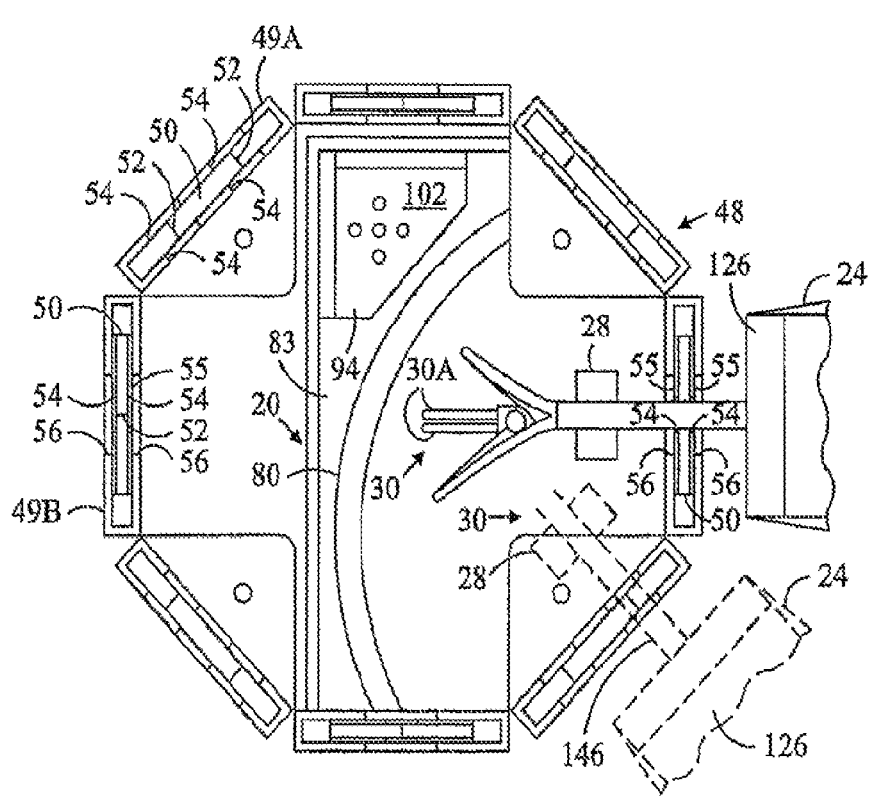
FIG. 5B is an enlarged top sectional view taken along line 5B-5B of FIG. 1.
Figure 6:
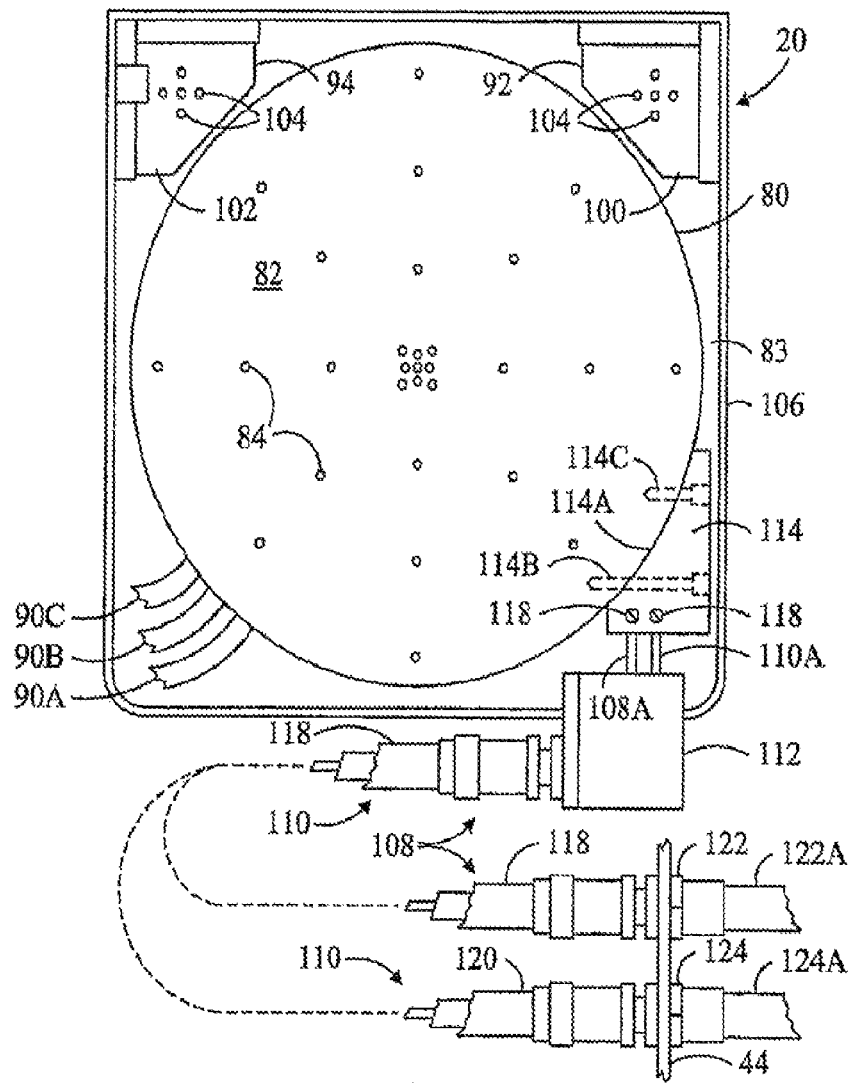
FIG. 6 is a partially schematic top detail view of the chuck assembly, taken along line 6-6 of FIG. 3.
Figure 7:
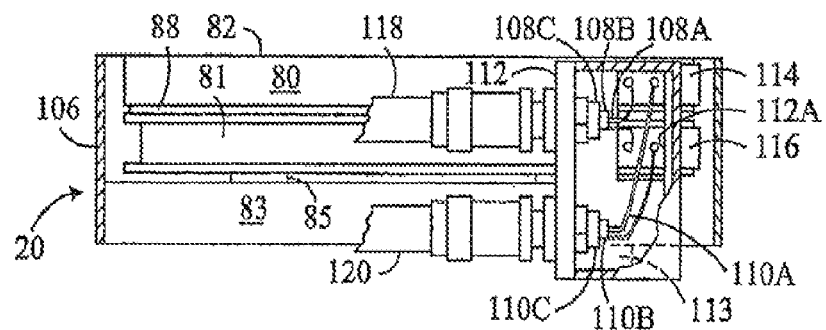
FIG. 7 is a partially sectional front view of the chuck assembly of FIG. 6.
Figure 8:
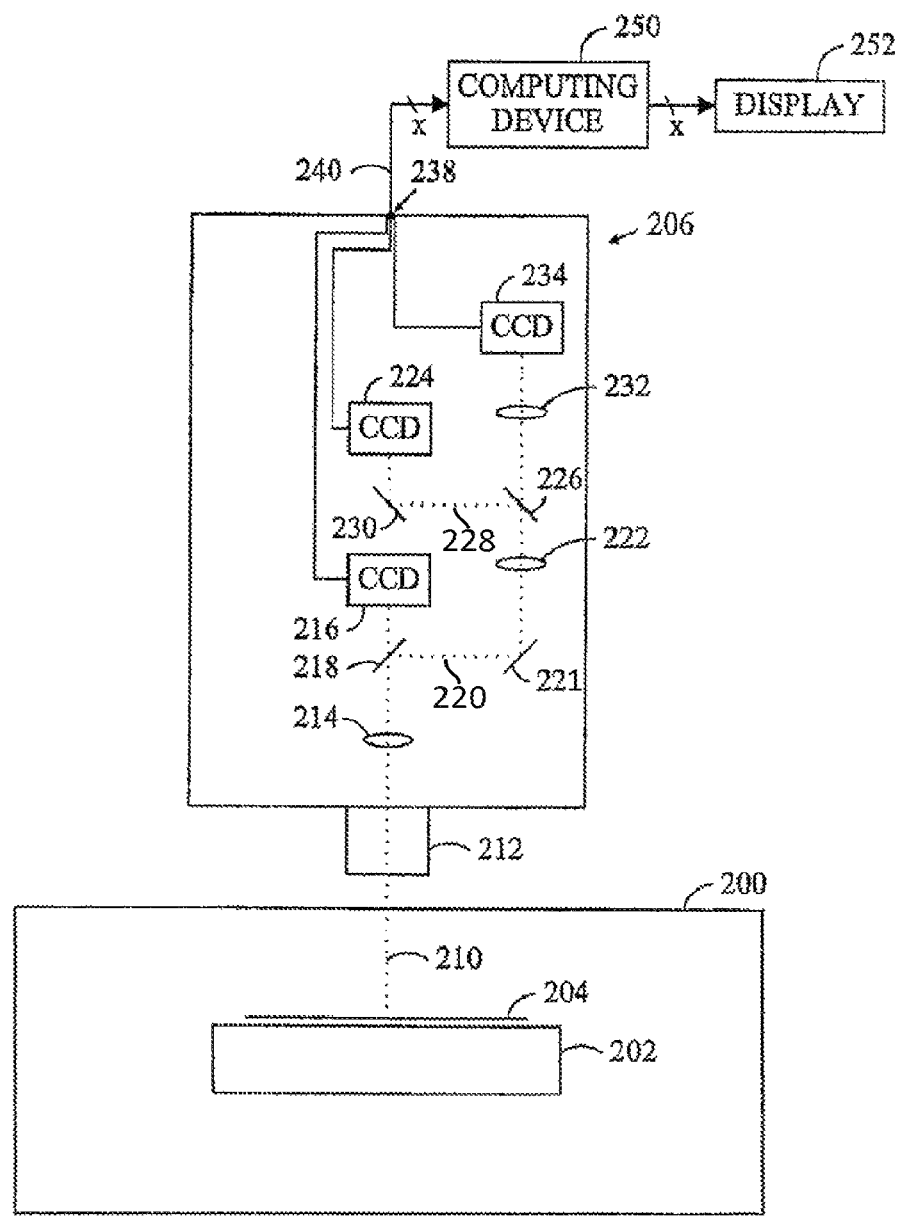
FIG. 8 illustrates a probing system together with a microscope.

Referring to FIG. 8, a probing system may include a probing environment 200 having a support 202 for a wafer 204 together with a microscope 206. The microscope 206 preferably includes a single optical path 210 that passes through an objective lens 212. In addition, the system preferably only includes a single optical path for imaging the device under test or otherwise a single optical path is being used to automatically position the probe on the device under test. By including a single optical path 210 from the device under test, the registration and alignment that would have been otherwise necessary between different objective lens from a plurality of microscopes is alleviated. The optical path may pass through a first lens 214 which images the light from the device under test on a first imaging device 216, such as a charge coupled device. An optical splitting device 218 may be used to direct a portion 220 of the light from being imaged on the first imaging device 216. The light 220 may be reflected by a mirror 221 and pass through a second lens 222. An optical splitting device 226 and mirror 230 may be used to direct a portion 228 of the light being imaged on a second imaging device 224. Accordingly, the light from the second lens 222 images the light on a second imaging device 224. The light passing through the optical splitting device 226 passes through a lens 232 and is imaged on a third imaging device 234.

The first imaging device 216 images the device under test at a first magnification based upon the objective lens 212 and the first lens 214. Normally the first imaging device 216 images a relatively wide field of view.

The second imaging device 224 images the device under test at a second magnification based upon the objective lens 212, the first lens 214, and the second lens 222. Normally the second imaging device 216 images a medium field of view, being of a greater magnification than the relatively wide field of view of the first imaging device 216.

The third imaging device 234 images the device under test at a third magnification based upon the objective lens 212, the first lens 214, the second lens 222, and the third lens 232. Normally the third imaging device 234 images a narrow field of view, being of a greater magnification than the medium field of view of the second imaging device 224.

With a wide field of view for the first imaging device 216, the large features of the device under test may be observed. With the narrower field of view of the second imaging device 224, the smaller features of the device under test may be observed. With the increasingly narrower field of view of the third imaging device 234, the increasingly smaller features of the device under test may be observed. As it may be observed, the three imaging devices provide different fields of view of the same device. In addition, with the use of a single optical path 212 increases the likelihood that each of the images from each of the imaging devices are properly aligned with each other, such as centered one within another. Internal to the microscope there may be multiple optical paths.

In many cases, it is desirable to test the device under test at different temperatures. For example, the device under test may be tested across a very large range of −100 degrees C. (or less) to a range of 300 degrees C. (or more). As a result of the potential for large-temperature variations, during a particular test or test sequence, or probing at relatively extreme temperatures, the materials from which the probes and probe station are manufactured tend to significantly expand and compress. In addition, the relative expansion and compression tends to occur at different rates depending on the particular materials. This expansion and contraction results in difficulty in positioning the probe on ever decreasing sized pads for testing the device under test.

In order to assist in adjusting the position of the probe for testing the device under test, in some cases multiple cameras are arranged in the probing vicinity to obtain a three dimensional view of the probing environment. Based upon the three dimensional view of the probing environment, the position of the probe is adjusted to make suitable contact with the device under test. This technique may accommodate changes due to temperature, but results in significantly increased complexity due to multiple imaging devices used for probe positioning, each of which are positioned within a confined environment.

One of the issues that occurs with probing, especially when changing the temperature to a significantly increased temperature, is that the z-height of the probe relative to the device under test significantly increases, or vice versa. Similarly, when significantly decreasing the temperature, the z-height of the probe relative to the device under test may significantly decreases, or vice versa. In general, the probes may likewise change their position over the duration of the test in the x, y, and z directions. Depending on the type of probe and the duration of the test (e.g., 10 minutes to 10 days) this movement may be significant, and frequently results in inaccurate test data collection. The movement tends to be primarily caused by thermally induced mechanical expansion and contraction of the probe system. The probe system may include, for example, the probe body, the probe signal line (e.g., needles and/or tips), the probe mounting fixtures (e.g., probe arms or probe card holders), and the mechanical interconnection between the platen and the wafer chuck. This resulting relative movement of the probe tends to result in the probe being out of focus of the microscope, and thus the device under test and the probe are not simultaneously in focus. This lack of simultaneous focus results in difficulty determining of the location of the probe relative to the device under test, especially in the z-direction, and thus accurate placement of the device under test.

Historically, the pad sizes on the wafer tended to be relatively large (80-150 um) and generally lower testing temperatures resulted in a probing system that could readily accommodate the resulting mechanical errors and drift of the probing device. With ever decreasing integrated circuit geometry, there has been a corresponding ever decreasing pad size (such as 20-60 um) together with more extreme temperature testing. Thus it is more challenging to accurately test a substantial portion of the wafer due to the errors and drift in the probing device.

In order to use a single optical path from the microscope, and not require additional imaging devices viewing the probe from other directions in order to more accurately determine the position of the probe tip, it was determined that the amount of offset required to refocus on the probe tip is correlated to the vertical distance that the probe tip has changed. Accordingly, the focus of the microscope is incrementally modified for the probe tip (or other suitable structure on the probe) to evaluate the offset of the microscope when the probe tip (or other suitable structure on the probe) is substantially in focus. This evaluation is used to evaluate the distance that the probe tip has moved in the z-axis. Based upon the distance moved, the platen, probe, and/or chuck can be moved an appropriate distance to place the probe back in focus or otherwise determine a suitable amount of vertical movement during probing.

Figure 9:
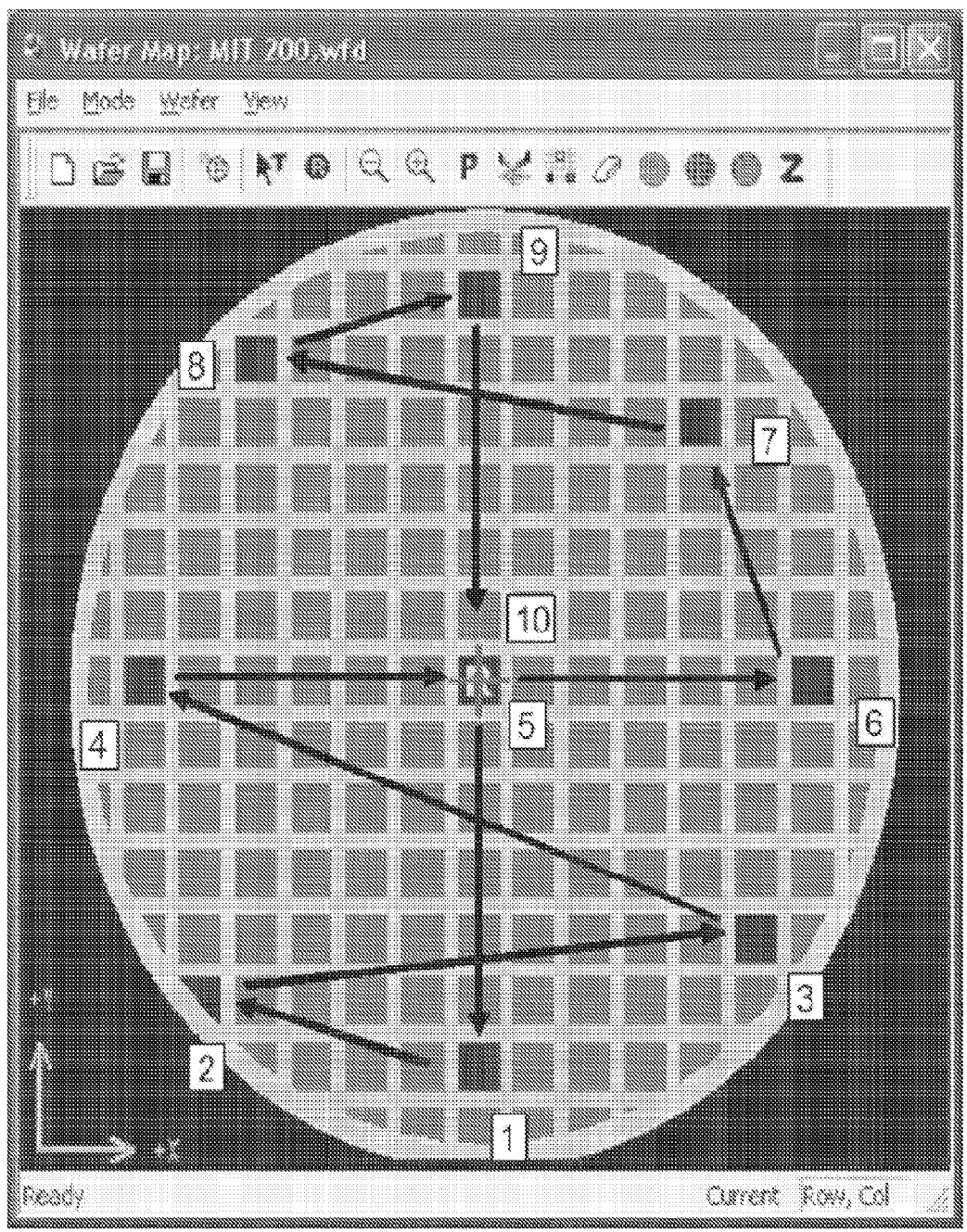
FIG. 9 illustrates a test probing pattern for a wafer.

Referring to FIG. 9, a set of tests may be selected for a test wafer. The movement over time of one or more probe tip needles, as the chuck is moved to different positions within the probe station is evaluated. For example, the wafer may be moved to 10 different die on the wafer, with a soaking time of 1 hour at each test location to determine the drift over time for correlation of the focus to the distance offset.

Figure 10:
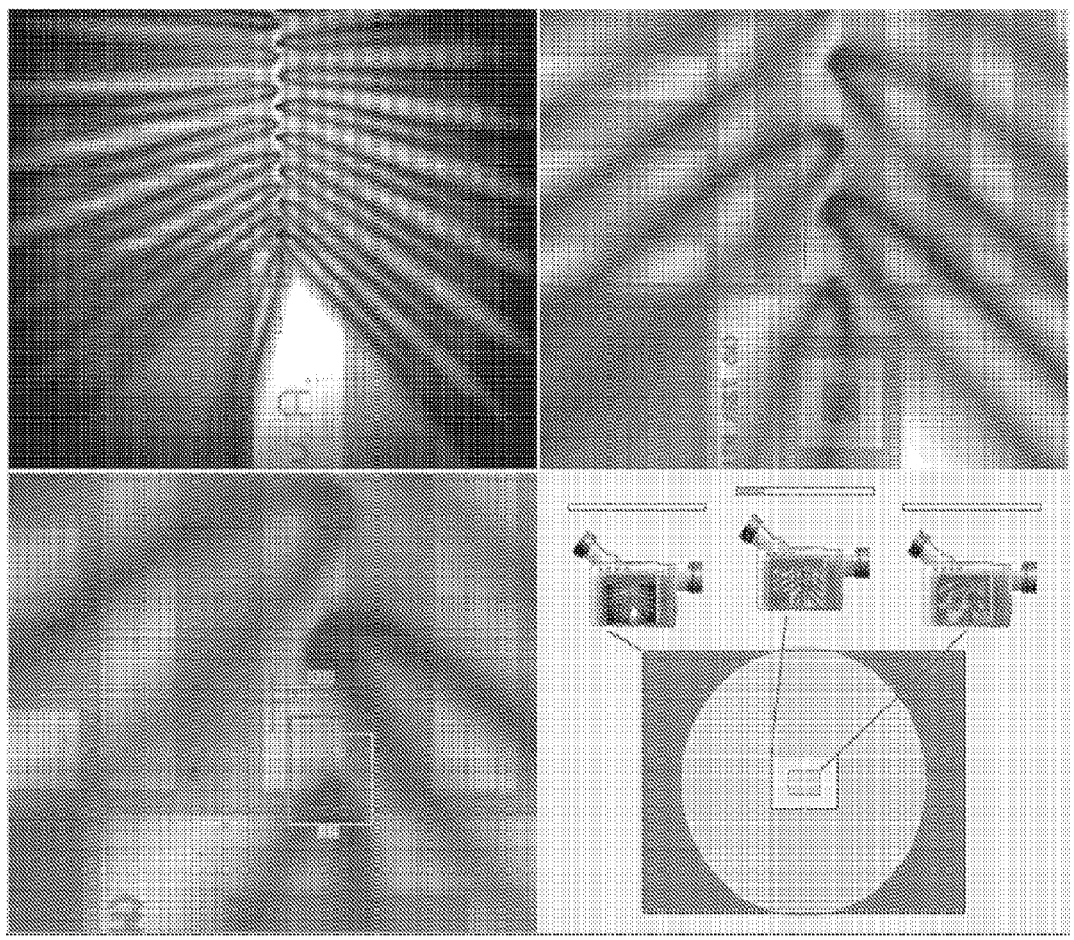
FIG. 10 illustrates a pattern recognition system for probe tips.

Referring to FIG. 10, a pattern recognition technique may be used to track the x and y movement of the probe tips.

Figure 11:
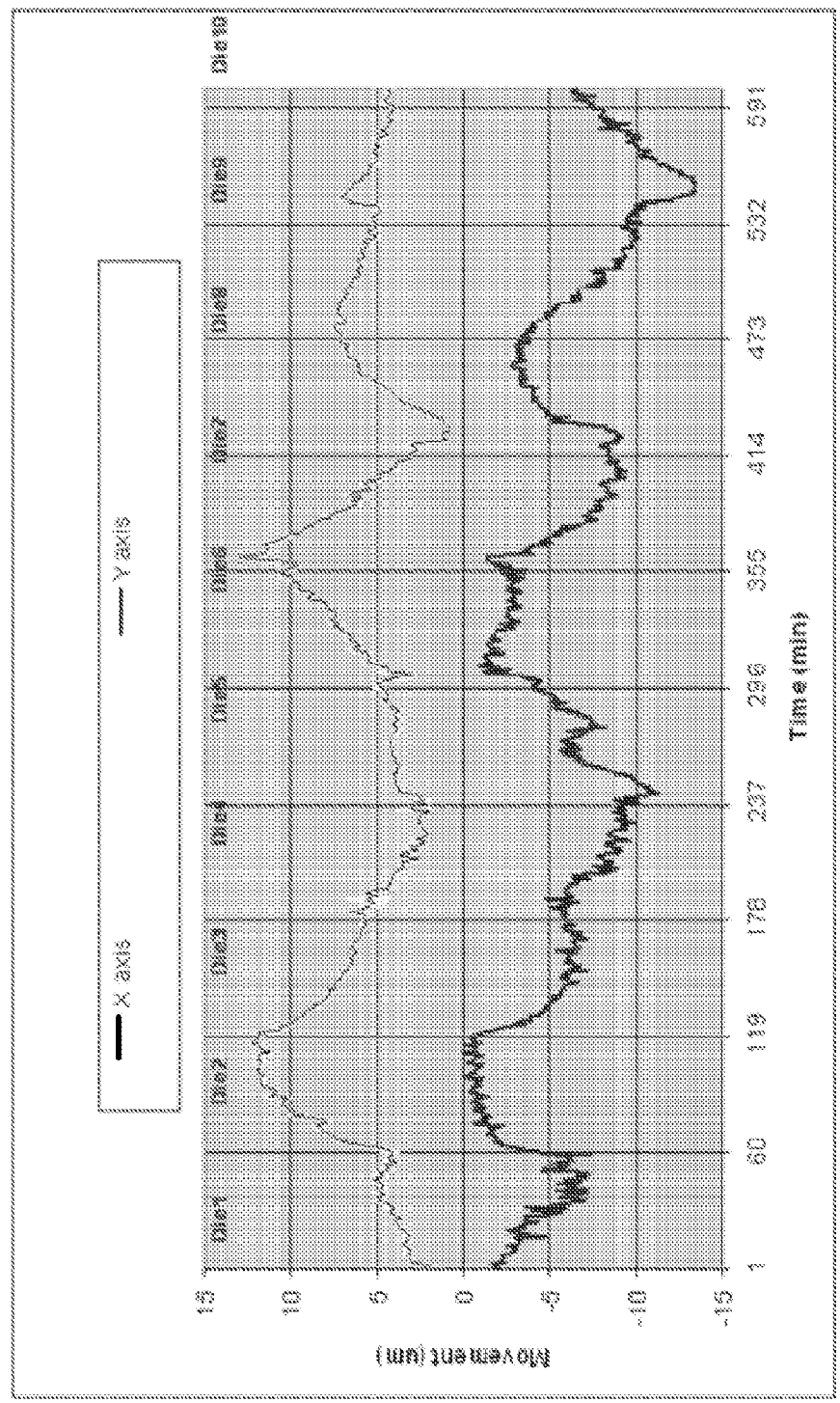
FIG. 11 illustrates X and Y drift over time.

Depending on the elevation of the probe tips, the image observed by the microscope varies. For example, as the probe tip raises it becomes increasingly blurred. Similarly, FIG. 11 illustrates the X and Y axis drift of the probe tip over time at each of the devices to be tested on the test wafer.

Figure 12:
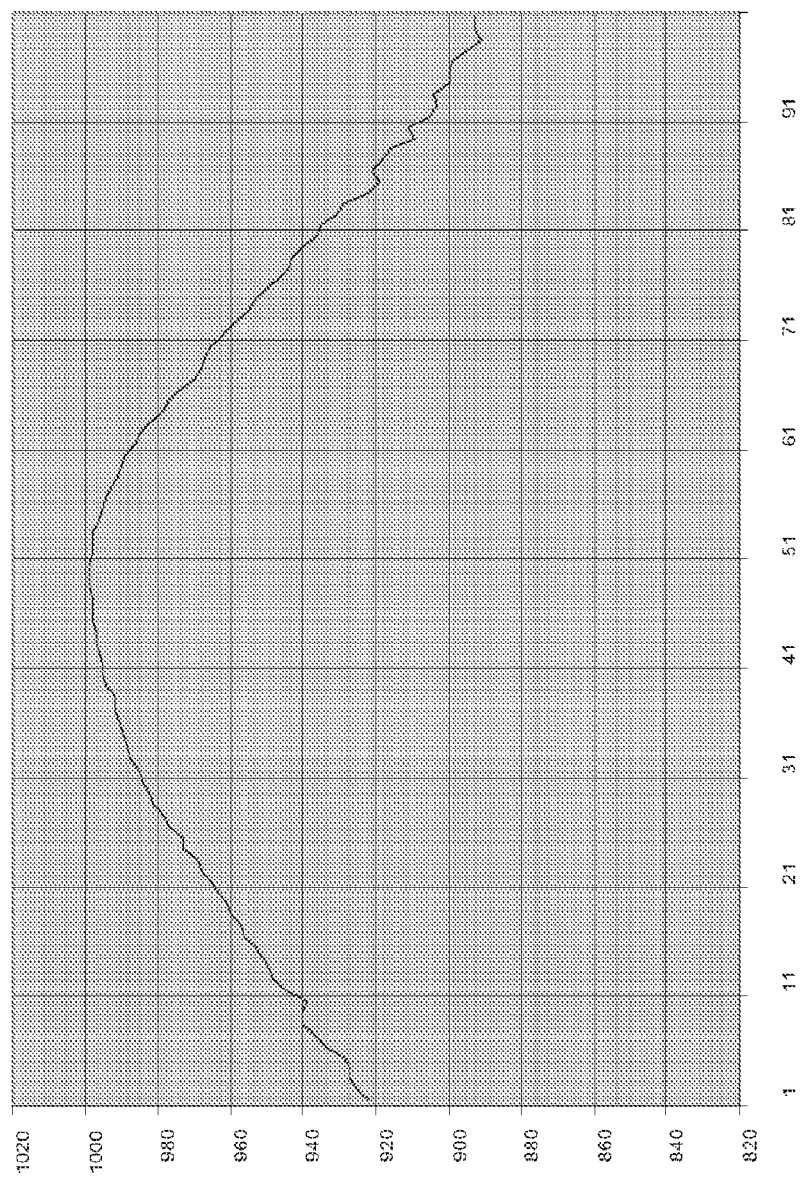
FIG. 12 illustrates pattern recognition relative to position of the focus of the probe to determine z-axis offset.

Referring to FIG. 12, by using any suitable pattern matching technique, the image obtained by the microscope at different focusing steps is provided with a matching score based upon an "ideal" image or otherwise a known "match". In general, any suitable image processing technique may be used to determine the amount of in-focus or out of focus state of the probe tips. The position that the probe tips are most in focus is then related to the distance that the probe tips are offset. This distance may be used to adjust the probing of the device under test.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A method for automatically probing a device under test, said method comprising:
    (a) receiving an image of a probe used to test the device under test through a single optical path of a microscope;
    (b) substantially focusing said microscope on said probe;
    (c) based upon said substantially focusing, automatically determining a vertical height adjustment between said probe and said device under test while the probe is not in contact with the device under test;
    (d) repeating said receiving said image, said substantially focusing said microscope, and said automatically determining for a plurality of different locations of said device under test to determine a plurality of said vertical height adjustments;
    (e) utilizing said plurality of vertical height adjustments to automatically adjust a distance between said device under test and said probe for a location not proximate one of said plurality of different locations of said device under test; and
    (f) increasing a temperature of the device under test, wherein, subsequent to the increasing, the method further includes refocusing on the probe, evaluating an offset of the microscope when the probe is substantially in focus, correlating an amount of the offset of the microscope to a change in a vertical position of the probe, and adjusting a distance between the probe and the device under test based upon the change in the vertical position.

2. The method of claim 1 wherein said image of said probe is proximate a probe tip of said probe.

3. The method of claim 1 further comprising adjusting the distance between said device under test and said probe at said location not proximate one of said plurality of different locations, based upon said plurality of vertical height adjustments, to bring the probe into contact with the device under test.

4. The method of claim 3 wherein said adjusting said distance includes moving a platen.

5. The method of claim 3 wherein said adjusting said distance includes moving a chuck.

6. The method of claim 3 wherein said adjusting said distance includes moving said probe.

7. The method of claim 1 wherein said plurality of vertical height adjustments are used to adjust a distance between said device under test and said probe based upon said vertical height adjustments at said plurality of different locations.

8. The method of claim 1 wherein differences in said plurality of vertical height adjustments are based upon changes in the temperature.

9. The method of claim 1, wherein the receiving includes receiving the image through the single optical pathway with a plurality of imaging devices, wherein the plurality of imaging devices includes at least a first imaging device with a first magnification and a first field of view, a second imaging device with a second magnification and a second field of view, and a third imaging device with a third magnification and a third field of view.

10. The method of claim 9, wherein the first imaging device includes a first charge coupled device (CCD), wherein the second imaging device includes a second CCD, wherein the third imaging device includes a third CCD, and further wherein the receiving includes receiving the image with the first CCD, the second CCD, and the third CCD.

11. The method of claim 9, wherein the third magnification is greater than the second magnification, wherein the second magnification is greater than the first magnification, wherein the first field of view is wider than the second field of view, wherein the second field of view is wider than the third field of view, and further wherein the receiving includes receiving a first image with the first imaging device, receiving a second image with the second imaging device, and receiving a third image with the third imaging device.

12. The method of claim 11, wherein the method further includes moving the probe relative to the device under test to align the probe with a conductive pad on the device under test, wherein the moving is based, at least in part, on at least one of the first image and the second image.

13. The method of claim 11, wherein the method further includes adjusting a distance between said device under test and said probe, and further wherein the adjusting is based, at least in part, on the third image.

14. The method of claim 1, wherein the method further includes automatically positioning the probe on the device under test based at least in part on the receiving and the substantially focusing.

15. The method of claim 1, wherein the substantially focusing includes utilizing a pattern matching technique to determine when the probe is in focus.

16. A method for automatically probing a device under test with a probe, the method comprising:
    (a) collecting an image through a single optical pathway of a microscope;
    (b) substantially focusing the microscope on the device under test;
    (c) substantially focusing the microscope on the probe;
    (d) automatically determining an amount of offset of the microscope based, at least in part, on the substantially focusing the microscope on the device under test and the substantially focusing the microscope on the probe;
    (e) automatically correlating the amount of offset to a vertical distance between the probe and the device under test when the probe is not in contact with the device under test; and
    (f) automatically adjusting the distance between the probe and the device under test to bring the probe into contact with the device under test, wherein the automatically adjusting is based, at least in part, on the automatically correlating.

17. The method of claim 16, wherein the method further includes moving the probe relative to the device under test to align the probe with a conductive pad on the device under test, wherein the moving is based, at least in part, on the image.

18. The method of claim 16, wherein the device under test is a selected device under test of a plurality of devices under test that are present on a wafer, wherein the method includes repeating the method for a first portion of the plurality of devices under test, and further wherein the method includes automatically contacting a second portion of the plurality of devices under test that is different from the first portion of the plurality of devices under test with the probe, wherein the automatically contacting includes automatically contacting without automatically determining the amount of offset for the second portion of the plurality of devices under test and without automatically correlating the amount of offset to the vertical distance for the second portion of the plurality of devices under test.

* * * * *